(12) United States Patent
Lin et al.

(10) Patent No.: US 9,978,729 B2
(45) Date of Patent: May 22, 2018

(54) SEMICONDUCTOR PACKAGE ASSEMBLY

(71) Applicant: MediaTek Inc., Hsin-Chu (TW)

(72) Inventors: Tzu-Hung Lin, Zhubei (TW); I-Hsuan Peng, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 9 days.

(21) Appl. No.: 14/986,207

(22) Filed: Dec. 31, 2015

(65) Prior Publication Data
US 2016/0260693 A1 Sep. 8, 2016

Related U.S. Application Data

(60) Provisional application No. 62/129,099, filed on Mar. 6, 2015.

(51) Int. Cl.
H01L 23/02 (2006.01)
H01L 25/10 (2006.01)
(Continued)

(52) U.S. Cl.
CPC ............ *H01L 25/105* (2013.01); *H01L 24/19* (2013.01); *H01L 25/16* (2013.01); *H01L 23/3128* (2013.01); *H01L 24/32* (2013.01); *H01L 24/48* (2013.01); *H01L 24/73* (2013.01); *H01L 25/0657* (2013.01); *H01L 2224/04042* (2013.01); *H01L 2224/12105* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2225/0651* (2013.01); *H01L 2225/06568* (2013.01); *H01L 2225/1035* (2013.01); *H01L 2225/1041* (2013.01); *H01L 2225/1058* (2013.01);
(Continued)

(58) Field of Classification Search
CPC . H01L 2924/19011; H01L 2924/19104; H01L 2924/1434; H01L 2924/1436; H01L 21/563
USPC ............... 257/686, 777, 723, 724, 778, 787
See application file for complete search history.

(56) References Cited

U.S. PATENT DOCUMENTS 7,242,081 B1 * 7/2007 Lee ..................... H01L 25/0657
257/686
7,659,609 B2 * 2/2010 Ha .......................... H01L 25/03
257/686

(Continued)

FOREIGN PATENT DOCUMENTS

CN 101996895 A 3/2011
KR 1020100030151 3/2010
(Continued)

*Primary Examiner* — S. V. Clark

(74) *Attorney, Agent, or Firm* — McClure, Qualey & Rodack, LLP

(57) ABSTRACT

The invention provides a semiconductor package assembly. The semiconductor package assembly includes a first semiconductor package including a first semiconductor die. A first molding compound surrounds the first semiconductor die. A first redistribution layer (RDL) structure is disposed on a bottom surface of the first molding compound. The first semiconductor die is coupled to the first RDL structure. A second redistribution layer (RDL) structure is disposed on a top surface of the first molding compound. A passive device is coupled to the second RDL structure.

30 Claims, 3 Drawing Sheets

(51) Int. Cl.
  *H01L 23/00*  (2006.01)
  *H01L 25/16*  (2006.01)
  *H01L 23/31*  (2006.01)
  *H01L 25/065* (2006.01)

(52) U.S. Cl.
  CPC ........... *H01L 2924/00014* (2013.01); *H01L 2924/1431* (2013.01); *H01L 2924/1432* (2013.01); *H01L 2924/1436* (2013.01); *H01L 2924/15311* (2013.01); *H01L 2924/181* (2013.01); *H01L 2924/19041* (2013.01)

(56) References Cited

U.S. PATENT DOCUMENTS

| | | | | |
|---|---|---|---|---|
| 7,989,269 | B2* | 8/2011 | Do | H01L 21/56 257/686 |
| 8,350,381 | B2* | 1/2013 | Theuss | B81C 1/00238 257/686 |
| 8,822,281 | B2* | 9/2014 | Pagaila | H01L 21/568 257/686 |
| 8,884,431 | B2* | 11/2014 | Lin | H01L 23/49816 257/686 |
| 2007/0145556 | A1* | 6/2007 | Bolken | H01L 23/3128 257/678 |
| 2007/0246813 | A1 | 10/2007 | Ong et al. | |
| 2008/0174008 | A1* | 7/2008 | Yang | G11C 5/02 257/723 |
| 2008/0186690 | A1 | 8/2008 | Miettinen et al. | |
| 2010/0140771 | A1* | 6/2010 | Huang | H01L 21/6835 257/686 |
| 2014/0042638 | A1 | 2/2014 | Liu et al. | |
| 2014/0077364 | A1 | 3/2014 | Marimuthu et al. | |
| 2014/0103488 | A1* | 4/2014 | Chen | H01L 24/83 257/532 |
| 2014/0252544 | A1 | 9/2014 | Li et al. | |
| 2014/0264933 | A1* | 9/2014 | Yu | H01L 21/768 257/774 |
| 2015/0235949 | A1 | 8/2015 | Yu et al. | |
| 2016/0336299 | A1 | 11/2016 | Marimuthu et al. | |

FOREIGN PATENT DOCUMENTS

| | | |
|---|---|---|
| TW | 201407724 | 2/2014 |
| TW | 201411746 | 3/2014 |

* cited by examiner

SEMICONDUCTOR PACKAGE ASSEMBLY

CROSS REFERENCE TO RELATED APPLICATIONS

This application claims the benefit of U.S. Provisional Application No. 62/129,099 filed on Mar. 6, 2015, the entirety of which is incorporated by reference herein.

BACKGROUND OF THE INVENTION

Field of the Invention

The present invention relates to a semiconductor package assembly, and in particular to a semiconductor package assembly with a passive device.

Description of the Related Art

In order to ensure miniaturization and multi-functionality of electronic products and communication devices, it is desired that semiconductor packages be small in size, to support multi-pin connection, high speeds, and high functionality. A conventional semiconductor package usually places passive devices on a printed circuit board (PCB). However, the PCB is required to provide additional area for the passive devices mounted thereon. It is hard to reduce the package size.

Thus, a novel semiconductor package assembly is desirable.

BRIEF SUMMARY OF THE INVENTION

A semiconductor package assembly is provided. An exemplary embodiment of a semiconductor package assembly includes first semiconductor package. The first semiconductor package includes a first semiconductor die. A first molding compound surrounds the first semiconductor die. A first redistribution layer (RDL) structure is disposed on a bottom surface of the first molding compound. The first semiconductor die is coupled to the first RDL structure. A second redistribution layer (RDL) structure is disposed on a top surface of the first molding compound. A passive device is coupled to the second RDL structure.

Another exemplary embodiment of a semiconductor package assembly includes a first semiconductor package. The first semiconductor package includes a first redistribution layer (RDL). A second redistribution layer (RDL) structure is disposed on the first RDL structure. A first molding compound has two opposite surfaces in contact with the first RDL structure and the second RDL structure, respectively. First vias pass through the first molding compound between the first RDL structure and the second RDL structure. A passive device is in contact with the second RDL structure and free from contact with the first molding compound.

Yet another exemplary embodiment of a semiconductor package assembly includes a first semiconductor package. The first semiconductor package includes a first molding compound having two opposite surfaces. A first redistribution layer (RDL) and a second redistribution layer (RDL) structure are disposed on the two opposite surfaces, respectively. First conductive structures are in contact with the first RDL structure. Also, the first conductive structures are free from contact with the first molding compound. A passive device is in contact with the second RDL structure and free from contact with the first molding compound.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
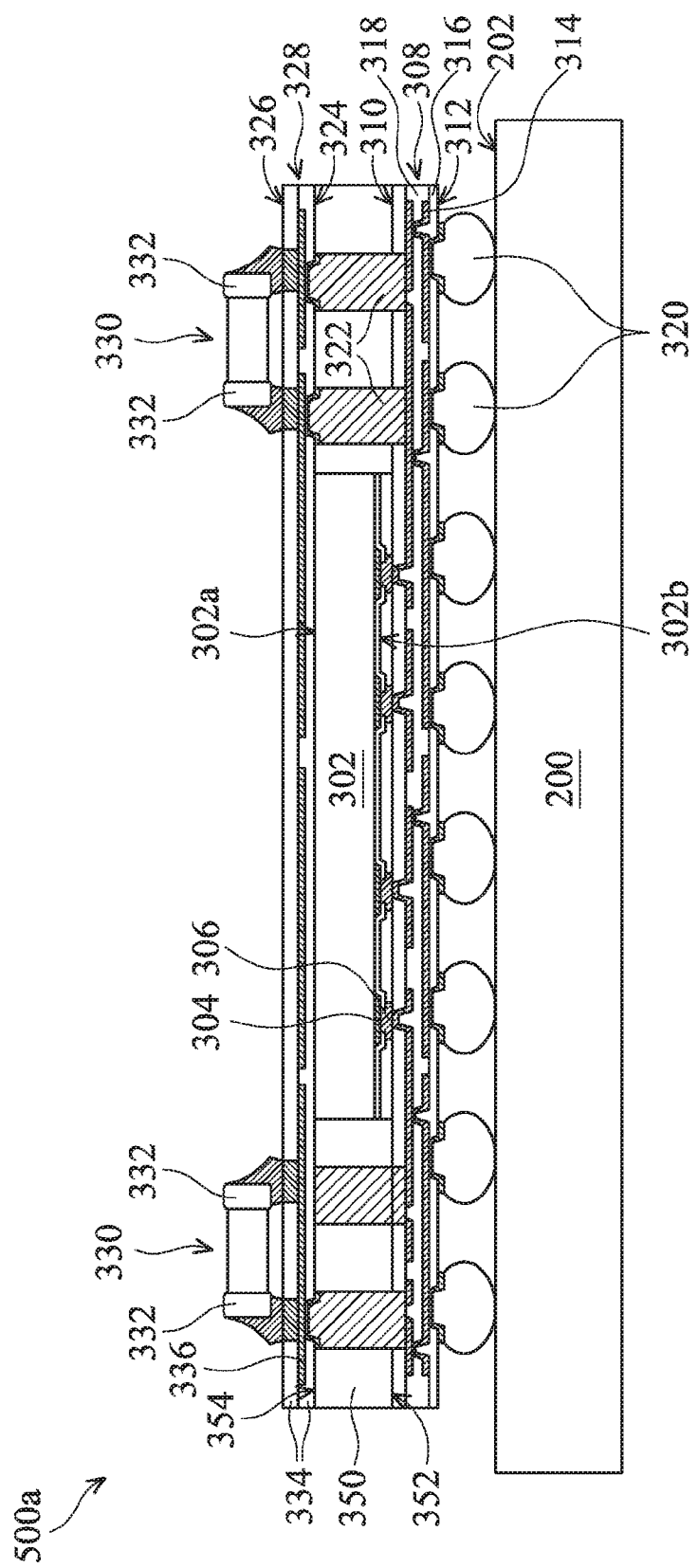
FIG. 1A is a cross-sectional view of a semiconductor package assembly including a semiconductor package in accordance with some embodiments of the disclosure.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

Figure 1B:
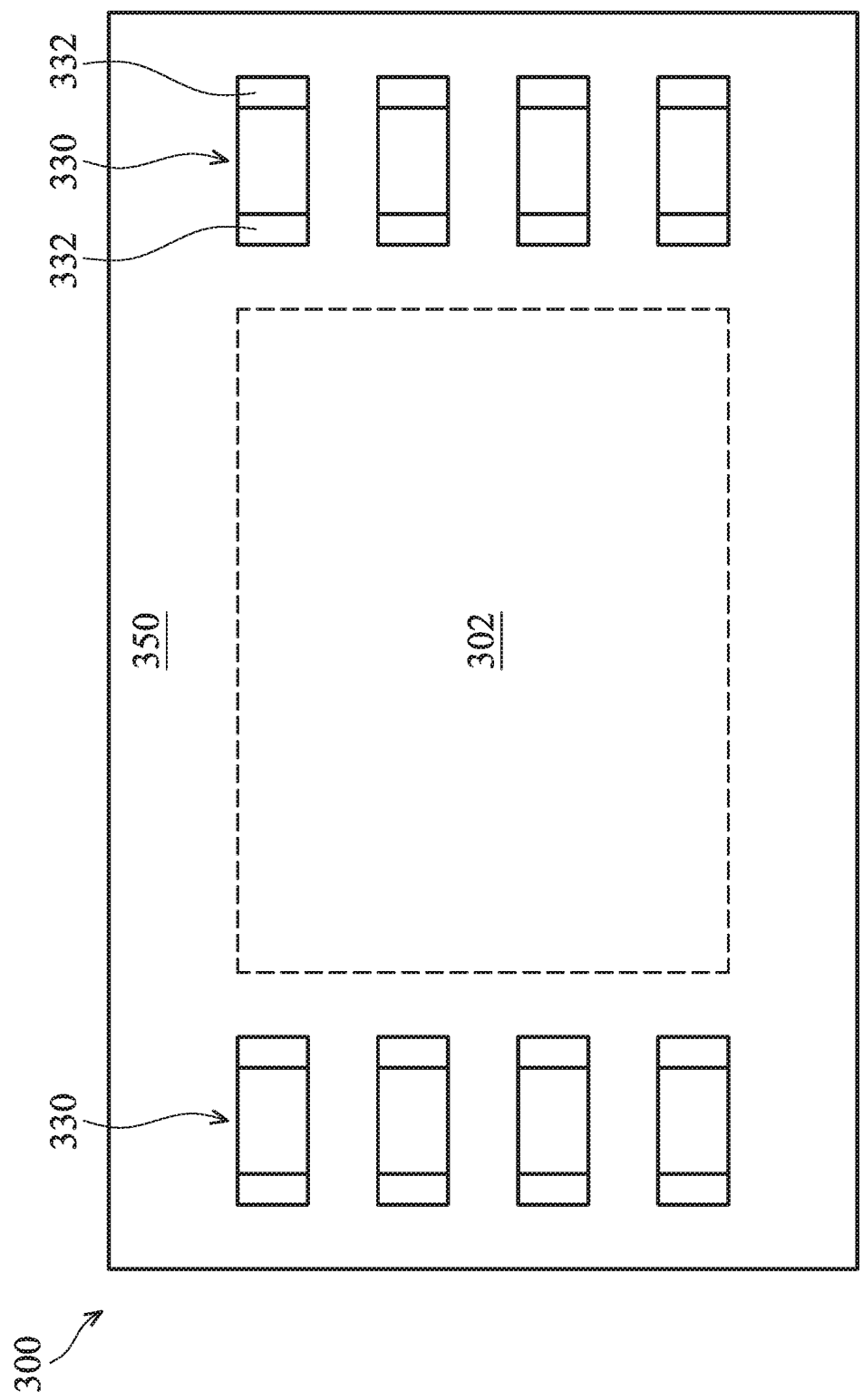
FIG. 1B is a top view of FIG. 1A, showing the arrangement of a semiconductor die and passive devices of the semiconductor package.

FIG. 1A is a cross-sectional view of a semiconductor package assembly 500a including a semiconductor package in accordance with some embodiments of the disclosure. In some embodiments, the semiconductor package assembly 500a is a package-on-package (POP) semiconductor package assembly or a system-in-package (SIP) semiconductor package assembly. FIG. 1B is a top view of FIG. 1A, showing the arrangement of a semiconductor die 302 and passive devices 330 of the semiconductor package assembly 500a. For clearly showing the arrangement of a substrate, the semiconductor die 302 and the passive devices 330 of the semiconductor package assembly 500a, a redistribution layer (RDL) structure under the passive devices 330 of the semiconductor package assembly 500a are not shown in FIG. 1B. Elements of the embodiments hereinafter that are the same or similar as those previously described with reference to FIG. 1B, are not repeated for brevity.

As shown in FIG. 1A, the semiconductor package assembly 500a includes at least one wafer-level semiconductor package mounted on a base 200. In this embodiment, the wafer-level semiconductor package includes a semiconductor package 300.

As shown in FIG. 1A, the base 200, for example a printed circuit board (PCB), may be formed of polypropylene (PP). It should also be noted that the base 200 can be a single layer or a multilayer structure. A plurality of pads (not shown) and/or conductive traces (not shown) is disposed on a die-attach surface 202 of the base 200. In one embodiment, the conductive traces may comprise power segments, signal trace segments or ground trace segments, which are used for the input/output (I/O) connections of the semiconductor package 300. Also, the semiconductor package 300 is mounted directly on the conductive traces. In some other embodiments, the pads are disposed on the die-attach surface 202, connected to different terminals of the conductive traces. The pads are used for the semiconductor package 300 mounted directly thereon.

As shown in FIG. 1A, the semiconductor package 300 is mounted on the die-attach surface 202 of the base 200 by a bonding process. The semiconductor package 300 is mounted on the base 200 through the conductive structures 320. The semiconductor package 300 includes a semiconductor die 302 and two redistribution layer (RDL) structures 308 and 328. The semiconductor die 302, for example, may include a logic die including a central processing unit (CPU), a graphics processing unit (GPU), a dynamic random access memory (DRAM) controller or any combination thereof. In another embodiment, the semiconductor die 302 may be a system on chip (SOC) chip and therefore the semiconductor package 300 includes a SOC chip package. Embodiments of the disclosure are not limited thereto. In some embodiments, the semiconductor package 300 may include an analog processing device package, a digital processing device package, or another suitable semiconductor package.

As shown in FIG. 1A, the semiconductor die 302 is fabricated by flip-chip technology. Pads 304 of the semiconductor die 302 are disposed on the front surface 302b to be electrically connected to the circuitry (not shown) of the semiconductor die 302. In some embodiments, the pads 304 belong to the uppermost metal layer of the interconnection structure (not shown) of the semiconductor die 302. The pads 304 of the semiconductor die 302 are in contact with the corresponding conductive structures 306, for example, conductive bumps. It should be noted that the number of semiconductor dies 302 integrated in the semiconductor package assembly 500a is not limited to that disclosed in the embodiment.

As shown in FIG. 1A, the semiconductor package 300 further includes a molding compound 350 covering and surrounding the semiconductor die 302. The molding compound 350 is in contact with the semiconductor die 302. The molded compound 350 has opposite surfaces 352 and 354 respectively close to the front surface 302b and the back surface 302a of the semiconductor die 302. The molding compound 350 may also cover a back surface 302a of the semiconductor die 302. In some embodiments, the molding compound 350 may be formed of a nonconductive material, such as an epoxy, a resin, a moldable polymer, or the like. The molding compound 350 may be applied while substantially liquid, and then may be cured through a chemical reaction, such as in an epoxy or resin. In some other embodiments, the molding compound 350 may be an ultraviolet (UV) or thermally cured polymer applied as a gel or malleable solid capable of being disposed around the semiconductor die 302, and then may be cured through a UV or thermal curing process. The molding compound 350 may be cured with a mold (not shown).

As shown in FIG. 1A, the semiconductor package 300 further includes two redistribution layer (RDL) structures 308 and 328 disposed over the front surface 302b and the back surface 302a of the semiconductor die 302. The RDL structure 308 is disposed on the surface 352 of the molding compound 350. The semiconductor die 302 of the semiconductor package 300 is connected to a surface 310 of the RDL structure 308 through conductive structures 306, for example, conductive bumps or solder pastes. The RDL structure 308 may be in contact with the molding compound 350. In some embodiments, the RDL structure 308 may have one or more conductive traces 314 disposed in one or more inter-metal dielectric (IMD) layers 318. Pad portions of the conductive traces 314 are exposed to openings of the solder mask layer 312. However, it should be noted that the number of conductive traces 314 and the number of IMD layers 318 shown in FIG. 1A is only an example and is not a limitation to the present invention.

As shown in FIG. 1A, the semiconductor package 300 further includes conductive structures 320 disposed on a surface 312 of the RDL structure 308 away from the semiconductor die 302. The conductive structures 320 are coupled to the conductive traces 314 through the exposed to openings of the solder mask layer 312. Also, the conductive structures 320 are separated from the molding compound 350 through the RDL structure 308. In other words, the conductive structures 320 are free from contact with the molding compound 350. In some embodiments, the conductive structures 320 may comprise a conductive bump structure such as a copper bump or a solder bump structure, a conductive pillar structure, a conductive wire structure, or a conductive paste structure.

As shown in FIG. 1A, the RDL structure 328 is disposed on the molding compound 350. A surface 324 of the RDL structure 328, which is close to the semiconductor die 302, is in contact with the opposite surface 354 of the molding compound 350. Similarly to the RDL structure 308, the RDL structure 328 may have one or more conductive traces 336 disposed in one or more inter-metal dielectric (IMD) layers 334. Pad portions of the conductive traces 336 are exposed to openings of one the IMD layers 334, which is away from the opposite surface 354 of the molding compound 350. However, it should be noted that the number of conductive traces 336 and the number of IMD layers 328 shown in FIG. 1A is only an example and is not a limitation to the present invention.

As shown in FIG. 1A, the RDL structure 328 is coupled to the RDL structure 308 by vias 322 passing through the molding compound 350 between the RDL structure 308 and the RDL structure 328. The semiconductor die 302 is surrounded by the vias 322. Two terminals of each of the vias 322 are respectively close to the surface 310 of the RDL structure 308 and the surface 324 of the RDL structure 328. Also, the surface 310 of the RDL structure 308 and the surface 324 of the RDL structure 328 are close to the semiconductor die 302, respectively. In some embodiments, the vias 322 may comprise through package vias (TPVs) formed of copper.

As shown in FIG. 1A, the semiconductor package 300 further includes one or more passive devices 330 mounted on and coupled to the RDL structure 328. The passive device 330 has two pads 332 in contact with a surface 326 of the RDL structure 328, which is away from the semiconductor die 302. It should be noted that the passive device 330 is free from being covered by the molding compound 350. Also, the passive device 330 is free from contact with the molding compound 350. In some embodiments, the passive device 330 may comprise a passive device chip, a multilayer ceramic chip capacitor (MLCC) device, etc.

FIG. 1B illustrates the arrangement of the semiconductor die 302 and the passive devices 330 of the semiconductor package 300. Because the RDL structure 328 (FIG. 1A), which is positioned directly on the top surface of the molding compound 350, has a redistribution (redirect) function to provide for the passive devices 330 mounted thereon. The passive devices 330 can be arranged within a boundary of the molding compound 350 in a top view as shown in FIG. 1B. Therefore, the passive device 330 can be coupled to the semiconductor die 302 without by external conductive structures, which are disposed outside of the semiconductor package 300 (e.g. the pads and/or conductive traces of the base 200) as shown in FIG. 1A.

Figure 2:
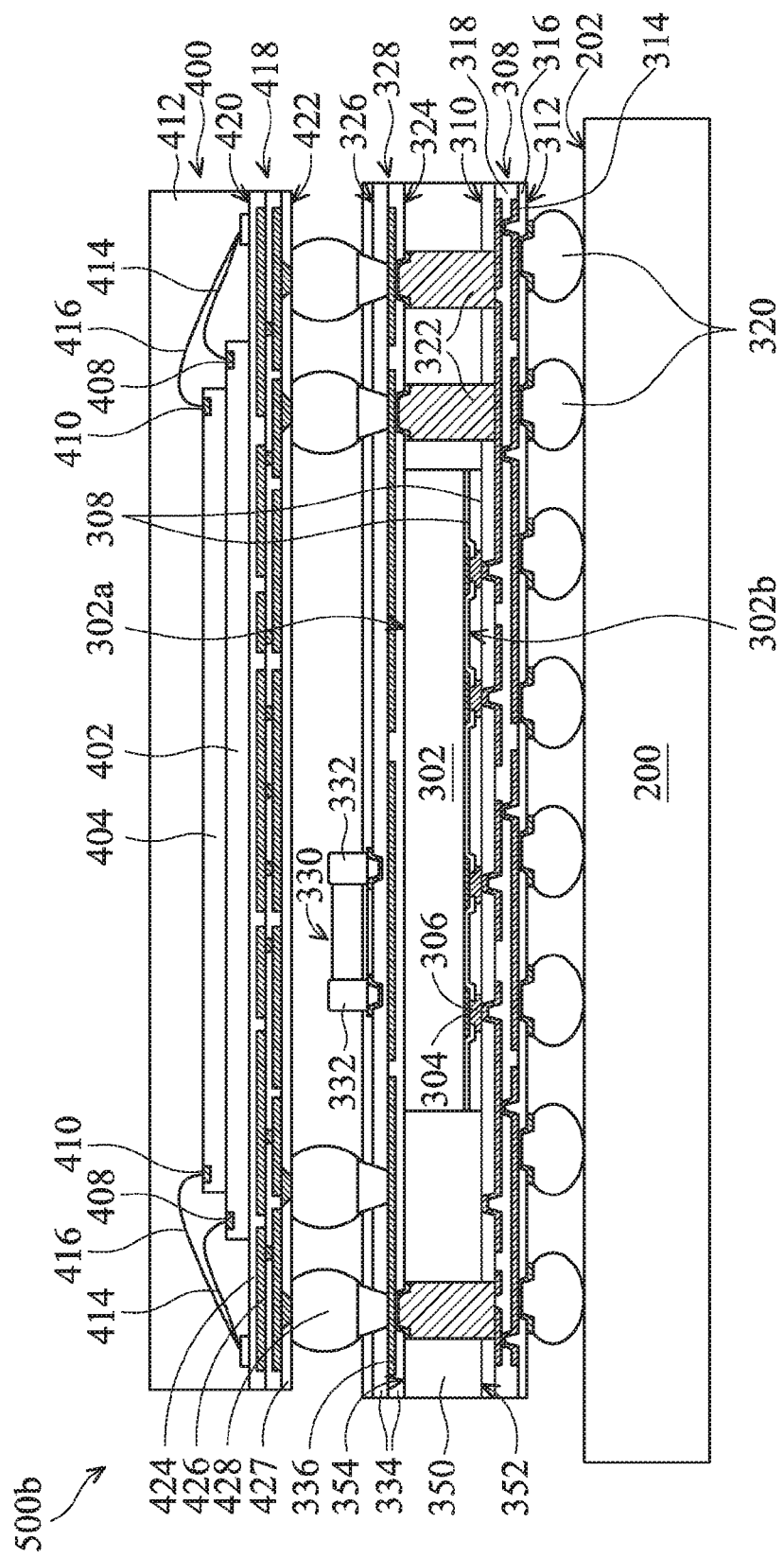
FIG. 2 is a cross-sectional view of a semiconductor package assembly including a semiconductor package and another semiconductor package stacked thereon in accordance with some embodiments of the disclosure.

FIG. 2 is a cross-sectional view of a semiconductor package assembly 500b including a semiconductor package 300 and a dynamic random access memory (DRAM) package 400 stacked thereon in accordance with some embodiments of the disclosure. To illustrate embodiments of the present disclosure, a DRAM package is depicted herein as an example. However, embodiments of the present disclosure are not limited to any particular application. Elements of the embodiments hereinafter that are the same or similar as those previously described with reference to FIGS. 1A-1B, are not repeated for brevity.

As shown in FIG. 2, one of the differences between the semiconductor package assembly 500a shown in FIG. 1A and the semiconductor package assembly 500b is that the semiconductor package assembly 500b further comprises a semiconductor package stacked on the semiconductor package 300 by a bonding process. In this embodiment, the semiconductor package includes a memory package, for example, a dynamic random access memory (DRAM) package 400. Embodiments of the disclosure are not limited thereto. In some embodiments, the semiconductor package stacked on the semiconductor package 300 may include an analog processing device package, a digital processing device package, or another suitable semiconductor package. The DRAM package 400 is mounted on the semiconductor package 300 through conductive structures 428. The DRAM package 400 is coupled to the RDL structure 308 of the by the RDL structure 328 and the vias 322 of the semiconductor package 300.

As shown in FIG. 2, the DRAM package 400 comprises a redistribution layer (RDL) structure 418, at least one semiconductor die (e.g. two semiconductor dies 402 and 404) and a molding compound 412. Because the DRAM package 400 is stacked on the semiconductor package 300, the RDL structure 328 is positioned between the RDL structure 308 and 418. The RDL structure 418 has opposite surface 420 and 422. The surface 420 is provide for semiconductor dies mounted thereon, and the surface 422 is provide for the conductive structures 428 attached thereon. Similarly to the RDL structure 308 and 328, the RDL structure 418 may have one or more conductive traces 426 disposed in one or more inter-metal dielectric (IMD) layers 424. Pad portions of the conductive traces 426 are exposed to openings of a solder mask layer 427. However, it should be noted that the number of conductive traces 426 and the number of IMD layers 424 shown in FIG. 2 is only an example and is not a limitation to the present invention.

In this embodiment as shown in FIG. 2, the semiconductor dies 402 and 404 are DRAM dies, respectively. The DRAM die 402 is mounted on the surface 420 of the RDL structure 418 with a paste (not shown). Also, the DRAM die 404 is stacked on the DRAM die 402 with a paste (not shown). The DRAM dies 402 and 404 may be coupled to the RDL structure 418 by bonding wires, for example bonding wires 414 and 416. However, the number of stacked DRAM dies is not limited to the disclosed embodiment. Alternatively, the two DRAM dies 402 and 404 as shown in FIG. 2 can be arranged side by side. Therefore, the DRAM dies 402 and 404 are mounted on the surface 420 of the RDL structure 418 by a paste (not shown).

As shown in FIG. 2, the molding compound 412 surrounds the DRAM dies 402 and 404. Also, the molding compound 412 is in contact with the surface 420 of the RDL structure 412 and the DRAM dies 402 and 404. Like molding compound 350, molding compound 412 may be formed of a nonconductive material, such as an epoxy, a resin, a moldable polymer, or the like.

As shown in FIG. 2, the DRAM package 400 further includes conductive structures 428 disposed on the surface 422 of the RDL structure 418, which is away from the DRAM dies 402 and 404. The conductive structures 428 are formed through the openings of the solder mask layer 427 to couple to the conductive traces 424. Also, the conductive structures 428 are separated from the molding compound 412 through the RDL structure 418. In other words, the conductive structures 428 are free from contact with the molding compound 418. It should be noted that the passive device 330 between the RDL structures 328 and 418 is surrounded by the conductive structures 428. Also, the passive device 330 is free from contact with the DRAM package 400. Like the conductive structures 320, the conductive structures 428 may comprise a conductive bump structure such as a copper bump or a solder bump structure, a conductive pillar structure, a conductive wire structure, or a conductive paste structure.

Many variations and/or modifications can be made to embodiments of the disclosure. For example, the semiconductor package assembly 500b is not limited to include a SOC chip package and a memory package vertically stacked on the SOC chip package. In some embodiments, the semiconductor package assembly 500b may include two stacked packages which are selected from a SOC chip package, a memory package, an analog processing package, a digital processing package, and other suitable semiconductor packages. For example, the semiconductor package 300 shown in FIG. 2 may be an analog processing package, and the DRAM package 400 shown in FIG. 2 may be replaced with a digital processing package.

Embodiments provide a semiconductor package assembly. The semiconductor package assembly includes at least one semiconductor package, for example, a system on chip (SOC) package. The semiconductor package includes a semiconductor die, a molding compound surrounds the semiconductor die, a top RDL structure and a bottom RDL structure. The top and bottom RDL structures are in contact with the top and bottom surfaces of the molding compound, respectively. The SOC package further includes a passive device coupled to the RDL structure, which is disposed on the top surface of the molding compound. Alternatively, the semiconductor package assembly further includes another semiconductor package, for example, a dynamic random access memory (DRAM) package, vertically stacked thereon. It should be noted that passive device disposed on the top RDL structure is free from contact with the molding compound of the semiconductor package and the other semiconductor package.

The semiconductor package assembly in accordance with some embodiments of the disclosure has the following advantages. The RDL structure, which is positioned directly on the bottom surface of the molding compound, has a redistribution (redirect) function to provide for the semiconductor die mounted thereon. Also, the RDL structure, which is positioned directly on the top surface of the molding compound, has a redistribution (redirect) function to provide for the passive device mounted thereon. Also, the vias, which pass through the molding compound and connect to the two RDL structures, may serve as internal conductive structures of the semiconductor package. Therefore, the passive device can be coupled to the semiconductor die without external conductive structures which are disposed outside of the semiconductor package (e.g. the pads and/or conductive traces of the base). The signal integrity/power integrity (SI/PI) performance of the semiconductor package assembly can be improved due to the shortened RDL routing path. The area of the base can be reduced further. Also, the semiconductor package assembly further includes an RDL structure, which is positioned directly on the top surface of the molding compound, and may provide integration flexibility, such as device insertion and thermal solution. Furthermore, the two RDL structures fabricated using a similar process may provide comparable process capability in the semiconductor package assembly.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package assembly, comprising:
a first semiconductor package, comprising:
    a first semiconductor die;
    a first molding compound surrounding the first semiconductor die;
    a first redistribution layer (RDL) structure disposed on a bottom surface of the first molding compound, wherein the first semiconductor die is coupled to the first RDL structure;
    a second redistribution layer (RDL) structure disposed on a top surface of the first molding compound; and
    a passive device physically contacting a top surface of the second RDL structure to directly electrically couple the passive device to the second RDL structure, wherein the passive device is coupled to the first semiconductor die without external conductive structures disposed outside of the first semiconductor package; and
a second semiconductor package stacked on the first semiconductor package and free from contact with the passive device, the second semiconductor package comprising:
    a third redistribution layer (RDL) structure positioned such that the passive device is disposed between the second RDL structure and the third RDL structure; and
    a second semiconductor die coupled to the second RDL structure.

2. The semiconductor package assembly as claimed in claim 1, wherein the first semiconductor package comprises:
first conductive structures disposed on a first surface of the first RDL structure away from the first semiconductor die, wherein the first conductive structures are coupled to the first RDL structure.

3. The semiconductor package assembly as claimed in claim 2, wherein the passive device is disposed on a first surface of the second RDL structure away from the first semiconductor die.

4. The semiconductor package assembly as claimed in claim 1, wherein the passive device is free from being covered by the first molding compound.

5. The semiconductor package assembly as claimed in claim 3, wherein the second RDL structure is coupled to the first RDL structure by first vias passing through the first molding compound between the first RDL structure and the second RDL structure.

6. The semiconductor package assembly as claimed in claim 5, wherein the first semiconductor die is surrounded by the first vias.

7. The semiconductor package assembly as claimed in claim 5, wherein two terminals of each of the first vias are respectively close to a second surface of the first RDL structure and a second surface of the second RDL structure, and wherein the second surface of the first RDL structure and the second surface of the second RDL structure are close to the first semiconductor die.

8. The semiconductor package assembly as claimed in claim 5, further comprising:
a second molding compound surrounding the second semiconductor die, being in contact with the third RDL structure and the second semiconductor die.

9. The semiconductor package assembly as claimed in claim 8, wherein the second RDL structure is disposed between the first RDL structure and the third RDL structure.

10. The semiconductor package assembly as claimed in claim 8, wherein the second semiconductor package comprises:
second conductive structures disposed on a surface of the third RDL structure, which is away from the second semiconductor die, wherein the second conductive structures are coupled to the third RDL structure.

11. The semiconductor package assembly as claimed in claim 10, wherein the passive device is surrounded by the second conductive structures.

12. The semiconductor package assembly as claimed in claim 8, wherein the passive device is free from contact with the first molding compound.

13. The semiconductor package assembly as claimed in claim 8, wherein the second semiconductor package is coupled to the first RDL structure by the second RDL structure and the first vias.

14. The semiconductor package assembly as claimed in claim 8, wherein the first semiconductor die is a system-on-chip (SOC) die, and the second semiconductor die is a dynamic random access memory (DRAM) die.

15. The semiconductor package assembly as claimed in claim 14, wherein the first semiconductor package is a system-on-chip (SOC) package, and the second semiconductor package is a DRAM package.

16. A semiconductor package assembly, comprising:
a first semiconductor package, comprising:
    a first redistribution layer (RDL);
    a second redistribution layer (RDL) structure on the first RDL structure;
    a first molding compound having two opposite surfaces in contact with the first RDL structure and the second RDL structure, respectively; and
    first vias passing through the first molding compound between the first RDL structure and the second RDL structure; and
    a passive device in direct physical contact with a top surface of the second RDL structure to directly electrically couple the passive device to the second RDL structure, wherein the passive device is free from contact with the first molding compound, and wherein the passive device is coupled to the first semiconductor die without external conductive structures disposed outside of the first semiconductor package; and
a second semiconductor package stacked on the first semiconductor package and free from contact with the passive device, the second semiconductor package comprising:

a third redistribution layer (RDL) structure positioned such that the passive device is disposed between the second RDL structure and the third RDL structure; and
a dynamic random access memory (DRAM) die coupled to the second RDL structure.

17. The semiconductor package assembly as claimed in claim 16, further comprising:
a system-on-chip (SOC) die coupled to the first RDL structure and surrounded by the first molding compound and the first vias.

18. The semiconductor package assembly as claimed in claim 17, wherein the system-on-chip (SOC) die is coupled to a surface of the first RDL structure, which is close to the system-on-chip (SOC) die.

19. The semiconductor package assembly as claimed in claim 17, wherein the passive device is in contact with a surface of the second RDL structure, which is away from the system-on-chip (SOC) die.

20. The semiconductor package assembly as claimed in claim 17, wherein the first semiconductor package comprises:
first conductive structures disposed on a surface of the first RDL structure, which is away from the system-on-chip (SOC) die, wherein the first conductive structures are coupled to the first RDL structure.

21. The semiconductor package assembly as claimed in claim 16, wherein the first vias are coupled to the first RDL structure and the second RDL structure.

22. The semiconductor package assembly as claimed in claim 16, further comprising:
a second molding compound surrounding the DRAM die, being in contact with the third RDL structure and the DRAM die; and
second conductive structures disposed on a surface of the third RDL structure, which is away from the DRAM die, wherein the second conductive structures are coupled to the third RDL structure.

23. The semiconductor package assembly as claimed in claim 22, wherein the second RDL structure is disposed between the first RDL structure and the third RDL structure.

24. The semiconductor package assembly as claimed in claim 22, wherein the passive device is surrounded by the second conductive structures and free from contact with the second semiconductor package.

25. A semiconductor package assembly, comprising:
a first semiconductor package, comprising:
a first molding compound having two opposite surfaces;
a first redistribution layer (RDL) and a second redistribution layer (RDL) structure on the two opposite surfaces; and
first conductive structures in contact with the first RDL structure and free from contact with the first molding compound; and
a passive device in direct physical contact with a top surface of the second RDL structure to directly electrically couple the passive device to the second RDL structure, wherein the passive device is free from contact with the first molding compound, and wherein the passive device is coupled to the first semiconductor die without external conductive structures disposed outside of the first semiconductor package; and
a second semiconductor package stacked on the first semiconductor package and free from contact with the passive device, the second semiconductor package comprising:
a third redistribution layer (RDL) structure positioned such that the passive device is disposed between the second RDL structure and the third RDL structure; and
a dynamic random access memory (DRAM) die coupled to the second RDL structure.

26. The semiconductor package assembly as claimed in claim 25, further comprising:
a system-on-chip (SOC) die being coupled to the first RDL structure and surrounded by the first molding compound and first vias, wherein the first vias pass through the first molding compound between the first RDL structure and the second RDL structure.

27. The semiconductor package assembly as claimed in claim 26, wherein the first vias are coupled to the first RDL structure and the second RDL structure.

28. The semiconductor package assembly as claimed in claim 25, further comprising:
a second molding compound surrounding the DRAM die, being in contact with the third RDL structure and the DRAM die; and
second conductive structures disposed on a surface of the third RDL structure, which is away from the DRAM die, wherein the second conductive structures are coupled to the third RDL structure.

29. The semiconductor package assembly as claimed in claim 28, wherein the second RDL structure is disposed between the first RDL structure and the third RDL structure.

30. The semiconductor package assembly as claimed in claim 29, wherein the passive device is surrounded by the second conductive structures and is free from contact with the second semiconductor package.

* * * * *